(12) United States Patent
Hatada

(10) Patent No.: US 6,408,414 B1
(45) Date of Patent: Jun. 18, 2002

(54) SEMICONDUCTOR DEVICE PROVIDED WITH A BOUNDARY-SCAN TEST CIRCUIT

(75) Inventor: Hiroshi Hatada, Kanagawa-ken (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 09/334,827

(22) Filed: Jun. 17, 1999

(30) Foreign Application Priority Data

Jun. 19, 1998 (JP) .......................................... 10-173205

(51) Int. Cl.[7] .............................................. G01R 31/28
(52) U.S. Cl. ...................................... 714/727
(58) Field of Search ............................... 714/727, 726, 714/724, 728, 729, 733, 734

(56) References Cited

U.S. PATENT DOCUMENTS 5,465,348 A * 11/1995 Amemiya et al. ............. 714/4
5,793,778 A * 8/1998 Qureshi ...................... 714/727

OTHER PUBLICATIONS

IEEE Standard Test Access Port and Boundary–Scan Architecture, IEEE Std. 1149.1, Oct. 21, 1993, Chapter 8.

\* cited by examiner

*Primary Examiner*—Christine T. Tu
(74) *Attorney, Agent, or Firm*—Banner & Witcoff, Ltd.

(57) ABSTRACT

A semiconductor device provided with a compact Boundary-Scan test circuit is shown. The Boundary-Scan test circuit comprises a Boundary-Scan test register which is composed of bit elements serially connected to each other in the form of a scan path and each of which is connected respectively to one of pads of the semiconductor device, wherein part of the bit elements of said Boundary-Scan test register functions also as an ID-Code register while an initial bit element of said Boundary-Scan test register functions also as a bypass register for bypassing the subsequent bit elements of said Boundary-Scan test register.

11 Claims, 14 Drawing Sheets

| NSDARE | ADD | ADD1 | ADD2 | ADD | ADD | ADD5 | ADD | ADD7 | NOT USE |

SEMICONDUCTOR DEVICE PROVIDED WITH A BOUNDARY-SCAN TEST CIRCUIT

BACKGROUND OF THE INVENTION

1. Field of the Invention

The present invention is related to a semiconductor device provided with a Boundary-Scan test circuit.

2. Prior Art

To facilitate the testing of an electronic device, such as an integrated semiconductor circuit, or a circuit board such as a printed circuit board containing a plurality of integrated semiconductor circuits or even a group of boards, a testing technique called as "Boundary-Scan" has been developed.

FIG. 1 is a block schematic diagram of a circuit board design making use of a Boundary-Scan test circuit according to the prior art. In FIG. 1, each IC chip 102 mounted upon a circuit board 101 is provided with Boundary-Scan cells embedded therein which are connected in series with each other in order to form a scan path. Furthermore, a single elongated scan path is formed by serially connecting the Boundary-Scan cells of the respective chips on the circuit board 101. As a result, there is formed access to the IC chips 102 by making use of the scan path for inputting and outputting data for test from a scan-in port to a scan-out port in order to test wiring connection and so forth. It is therefore possible to conduct tests of detecting short or open circuits and other tests even in the case of a packaging substrate with high density components on which it is difficult to make physical (i.e., ohmic) contact therewith by means of a test probe.

FIG. 2 is a block diagram of a Boundary-Scan test circuit according to the prior art. In the figure, the minimum requirement for the Boundary-Scan test circuit is provision of a Test Access Port (TAP) controller 104, an instruction register 105 capable of serving as part of a scan path, an instruction decoder 110 for decoding an instruction as loaded onto the instruction register 15 and a test data register system 106 capable of serving as part of a scan path. The TAP controller 104 functions as a master controller for controlling the overall operation of the Boundary-Scan test circuit. One register of the test data register system 106 is selected by an instruction loaded onto the instruction register 105. The test data registers of the test data register system pursuant to the JTAG (for Joint Task Action Group) standard are the Boundary-Scan registers 107, the ID-Code registers 108 and the bypass registers 109.

FIG. 3 is a circuit diagram of a Boundary-Scan register according to the prior art. The Boundary-Scan register 107 is composed of a plurality of BS circuits 110 connected in series to each other for performing required operations such as serial shift operation through external pins or pads in accordance with the sampling instruction of the JTAG standard. FIG. 4 is a block diagram of the BS circuit 110 as illustrated in FIG. 3. In the figure, each BS circuit 110 is composed of a multiplexer 112 for selecting one of data PI given through the pad 111 and data SI inputted by the scan operation, and a register 113 for latching the data as selected by the multiplexer 112 in synchronism with the clock signal CKDR. In general, the BS circuits 110 has to perform exchanging data with the respective pads 111 so that the number of the BS circuits 110 corresponds to the number of the pads 111.

FIG. 5(A) is a block diagram of the ID-Code register 108 as illustrated in FIG.3. The ID-Code register 108 is composed of a plurality of ID circuits 114 connected in series to each other for electrically reading out the ID code of each chip. The ID code contains information of address, depth, I/O-Width, interface, and so forth. FIG. 5(B) is a block diagram of the ID circuit 114. In the figure, the ID circuit 114 is composed of a multiplexer 115 for selecting one of a data bit CI of an ID code represented by a high level (the electric power source level) or a low level (the ground level) and data SI inputted by the scan operation in accordance with a selection signal (SFDR), and a register 116 for latching the data as selected by the multiplexer 115 in synchronism with the clock signal CKDR. For example, in the case that the ID-Code register is provided to latch 32-bit data, it is composed of 32 equivalent circuits of the ID circuit 114.

The bypass register 109 is provided in order to bypass other registers of the test data register system. FIG. 6 is a block diagram of the bypass register 109 consisting of a negative AND gate 117 and a register 118 for latching the data as outputted by the negative AND gate 117 in synchronism with the clock signal CKDR.

In the case that a Boundary-Scan test circuit is designed in accordance with the JTAG standard, there have to be provided with these three types of the test data registers as illustrated in FIG. 7 which is a block diagram of the test data register system in accordance with the prior art.

One of the shortcomings of the LSIs with the test data register system of this kind is an area penalty. The overhead is therefore the area occupied by the Boundary-Scan test circuit which is provided only for the purpose of providing testability in addition to the proper of the LSI circuit for required functions. Particularly, the test data register system as illustrated in FIG. 7 requires a large amount of hardware resource (registers) and therefore results in most of the area penalty.

In order to face with the problem, it is proposed in Publication of Unexamined Patent Application No.Hei7-104035 to use one register as the Boundary-Scan register and the ID code register and to be switched with another register functioning as the bypass register. Also, Publication of Unexamined Patent Applications No.Hei7-151829 and No.Hei8-136619 disclose techniques to use one register as the Boundary-Scan register and the ID code register in order to reduce the hardware amount of the test data register system.

On the other hand, there is a need to make it easy to test semiconductor devices even in the fields handling a variety of semiconductor integrated circuits other than ASIC in the recent years. For example, it is desired to improve testability by providing the Boundary-Scan test circuit within chips in the case of the semiconductor storage devices. However, since the target is the class of ASICs in the case of the above described prior art Boundary-Scan test circuit, what can be extracted from a chip is only the ID code data which is hardwired data fixedly implemented within semiconductor chips, e.g., by selectively melting and disconnecting fuses. Because of this, in the case that the Boundary-Scan test circuit is implemented into semiconductor storage devices, the testability is not effectively improved by information only of the ID code given from the Boundary-Scan test circuit.

SUMMARY OF THE INVENTION

The present invention has been made in order to solve the shortcomings as described above. It is an important object of the present invention to provide a semiconductor device provided with a compact Boundary-Scan test circuit.

It is another associated object of the present invention to provide a semiconductor device provided with a Boundary- Scan test circuit capable of providing extended data useful for testing the semiconductor device.

In brief, the above and other objects and advantages of the present invention are provided by a new and improved semiconductor device provided with a Boundary-Scan test circuit comprising:

an instruction register for latching an instruction required for carrying out a Boundary-Scan test of the semiconductor device;

an instruction decoder for decoding an instruction as loaded onto the instruction register; and a test data register system controlled by control signals output from the instruction decoder;

the test data register system comprising a Boundary-Scan test register composed of bit elements serially connected to each other in the form of a scan path and each of which is connected respectively to one of pads of the semiconductor device, wherein part of the bit elements of the Boundary-Scan test register functions also as an ID-Code register which is capable of selectively outputting either of the ID-Code of the semiconductor device and extended data.

Also, in accordance with a preferred embodiment of the present invention, the instruction register functions as a scan path through which the instruction is loaded onto the instruction by scanning operation.

Furthermore, in accordance with a further preferred embodiment of the present invention, the extended data includes information for the manufacturer of the semiconductor device.

Furthermore, in accordance with a further preferred embodiment of the present invention, the extended data is indicative of whether or not there are available spare elements, the use of a fuse, or redundancy information about the spare elements such as redundancy addresses.

Furthermore, in accordance with a further preferred embodiment of the present invention, a Test Access Port controller for controlling operation of the Boundary-Scan test circuit is provided.

Furthermore, in accordance with a further preferred embodiment of the present invention, a multiplexer which selects and outputs one of the output signal of the initial bit element and the output signal of the last bit element in accordance with a control signal as generated from the instruction decoder is provided.

In accordance with another aspect of the present invention, a semiconductor device provided with a Boundary-Scan test circuit comprising:

an instruction register for latching an instruction required for carrying out a Boundary-Scan test;

an instruction decoder for decoding an instruction as loaded onto the instruction register; and a test data register system controlled by control signals output from the instruction decoder;

the test data register system comprising a Boundary-Scan test register composed of bit elements serially connected to each other in the form of a scan path and each of which is connected respectively to one of pads of the semiconductor device, wherein an initial bit element of the Boundary-Scan test register functions also as a bypass register for bypassing the subsequent bit elements of the Boundary-Scan test register.

In accordance with a further aspect of the present invention, a semiconductor device provided with a Boundary-Scan test circuit comprising:

an instruction register for latching an instruction required for carrying out a Boundary-Scan test;

an instruction decoder for decoding an instruction as loaded onto the instruction register; and a test data register system controlled by control signals output from the instruction decoder;

the test data register system comprising a Boundary-Scan test register composed of bit elements serially connected to each other in the form of a scan path and each of which is connected respectively to one of pads of the semiconductor device, wherein part of the bit elements of the Boundary-Scan test register functions also as an ID-Code register while an initial bit element of the Boundary-Scan test register functions also as a bypass register for bypassing the subsequent bit elements of the Boundary-Scan test register.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF EMBODIMENTS

In the following explanation, a Boundary-Scan test circuit in accordance with several embodiments will be explained in details with reference to figures.

Figure 1:
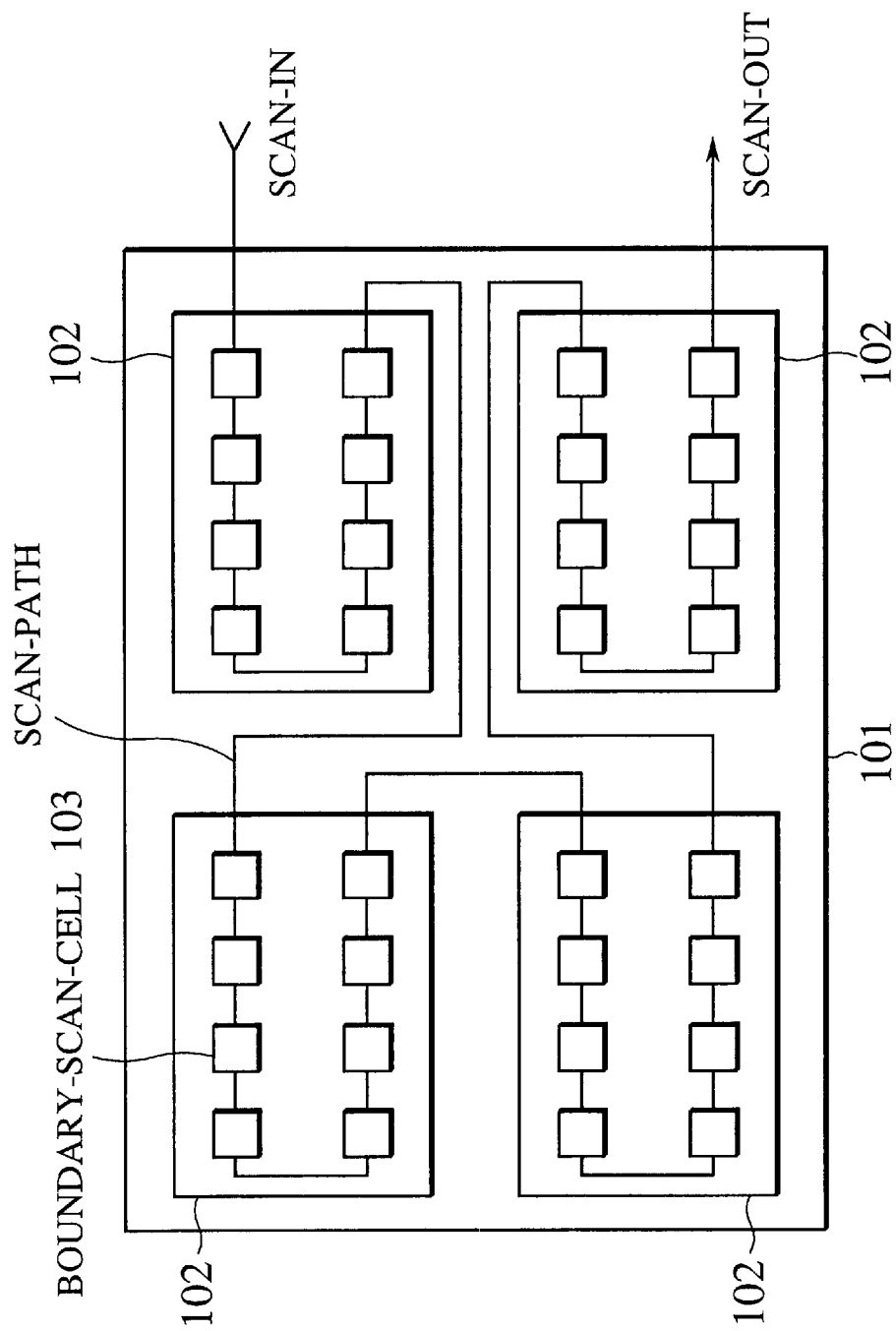
FIG. 1 is a block schematic diagram of a circuit board design making use of a Boundary-Scan test circuit according to the prior art.
Figure 2:
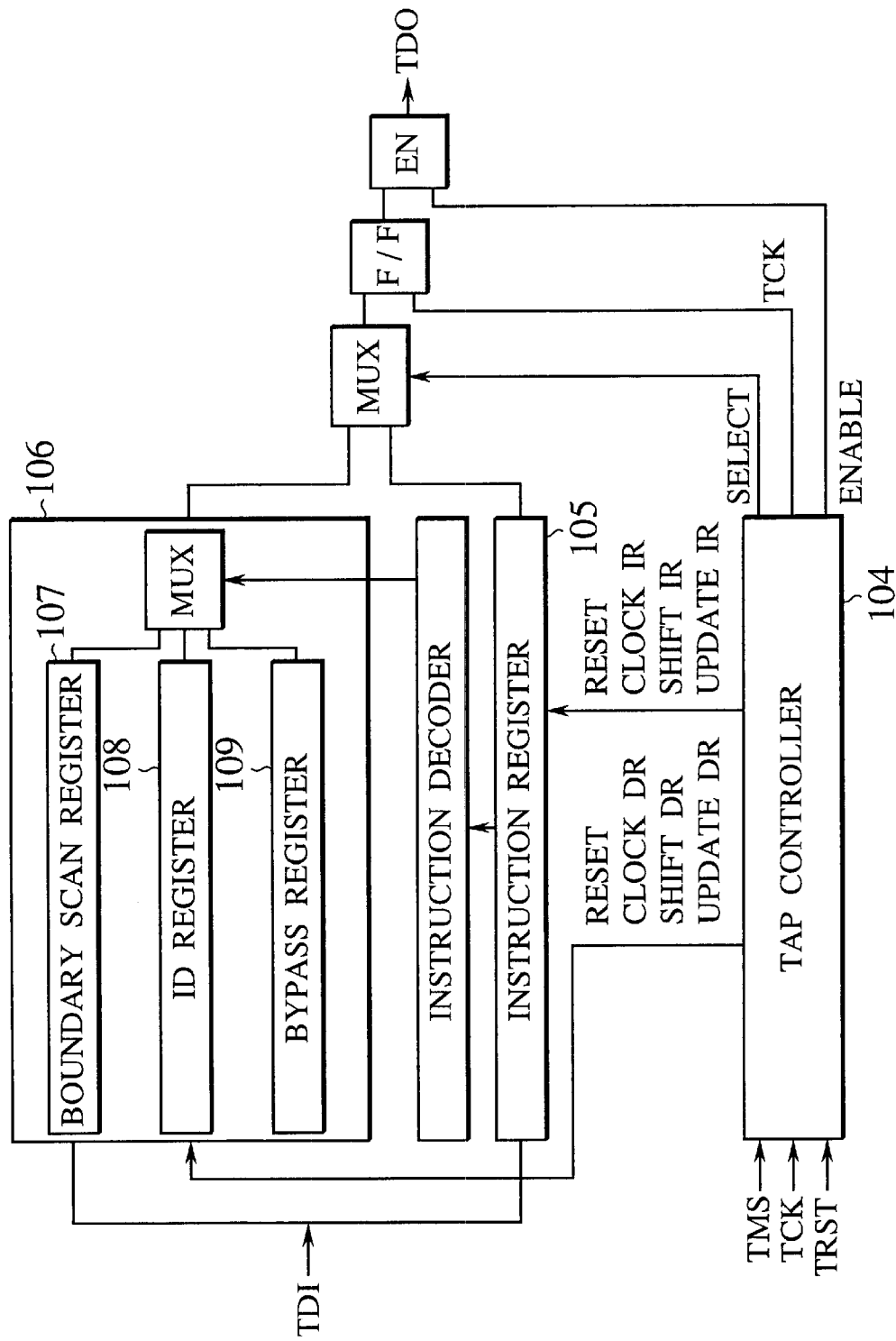
FIG. 2 is a block diagram of a Boundary-Scan test circuit according to the prior art.
Figure 3:
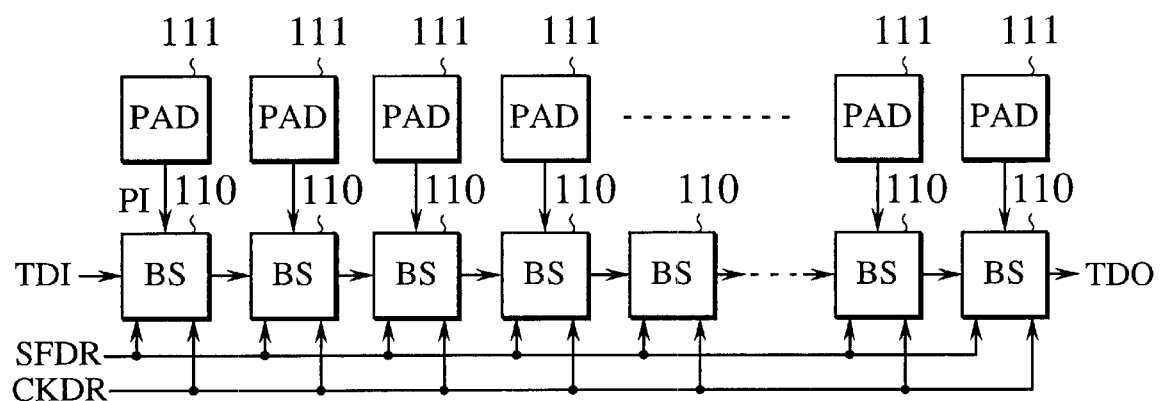
FIG. 3 is a circuit diagram of a Boundary-Scan register according to the prior art.
Figure 4:
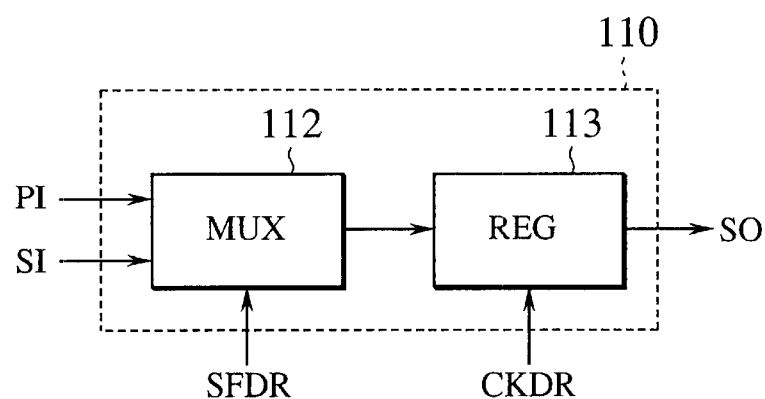
FIG. 4 is a block diagram of the BS circuit according to the prior art as illustrated in FIG. 3.
Figure 5A:
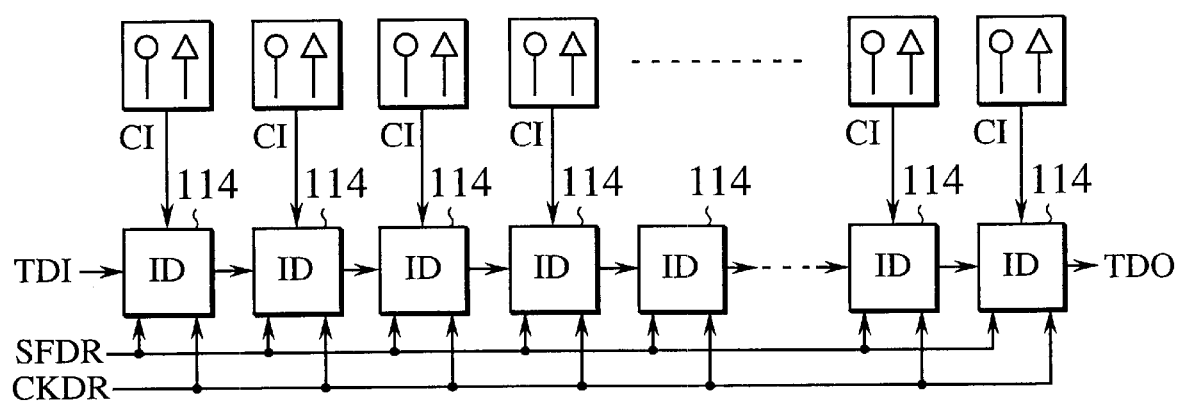
FIG. 5(A) is a block diagram of the ID-Code register according to the prior art as illustrated in FIG. 3.
Figure 5B:
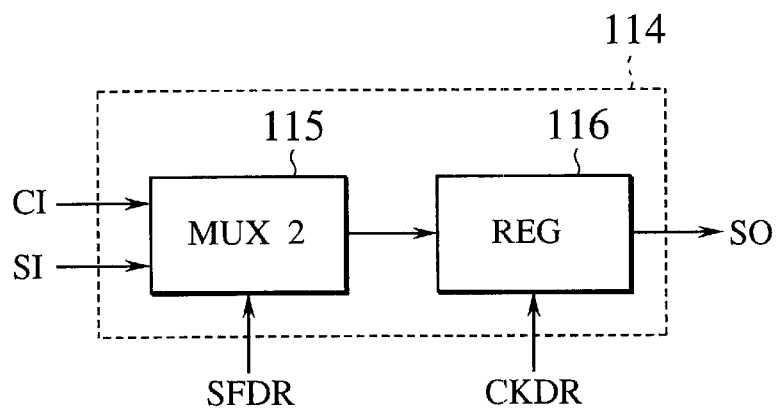
FIG. 5(B) is a block diagram of the ID circuit 114 according to the prior art as illustrated in FIG. 5(A).
Figure 6:
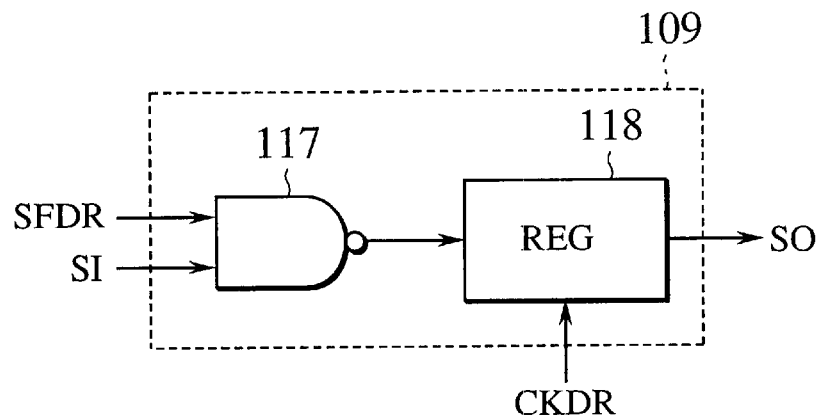
FIG. 6 is a block diagram of the bypass register according to the prior art as illustrated in FIG. 3.
Figure 7:
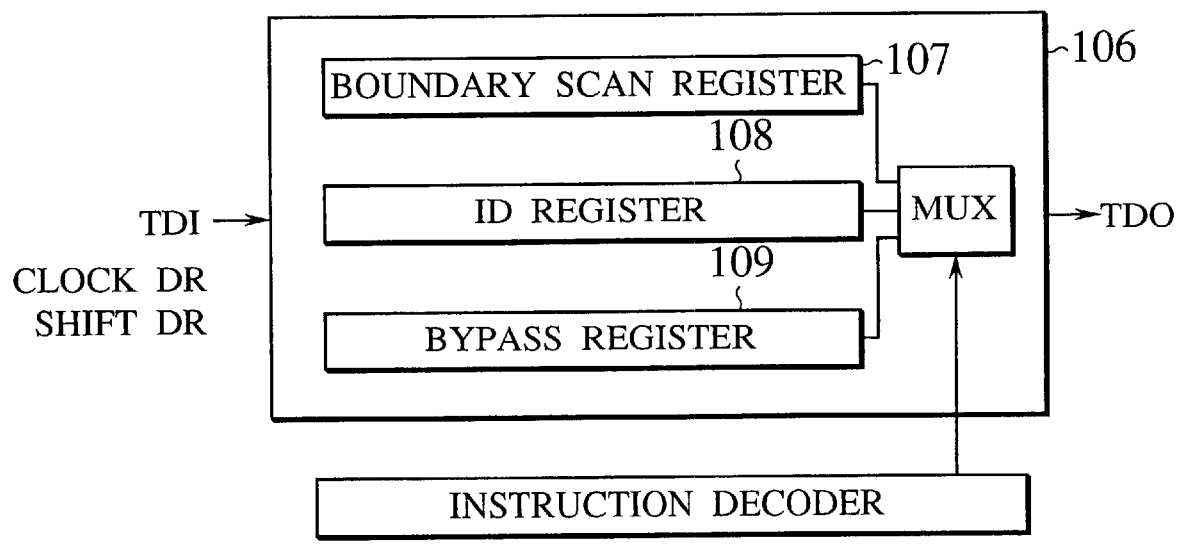
FIG. 7 is a block diagram of the test data register system in accordance with the prior art.
Figure 8:
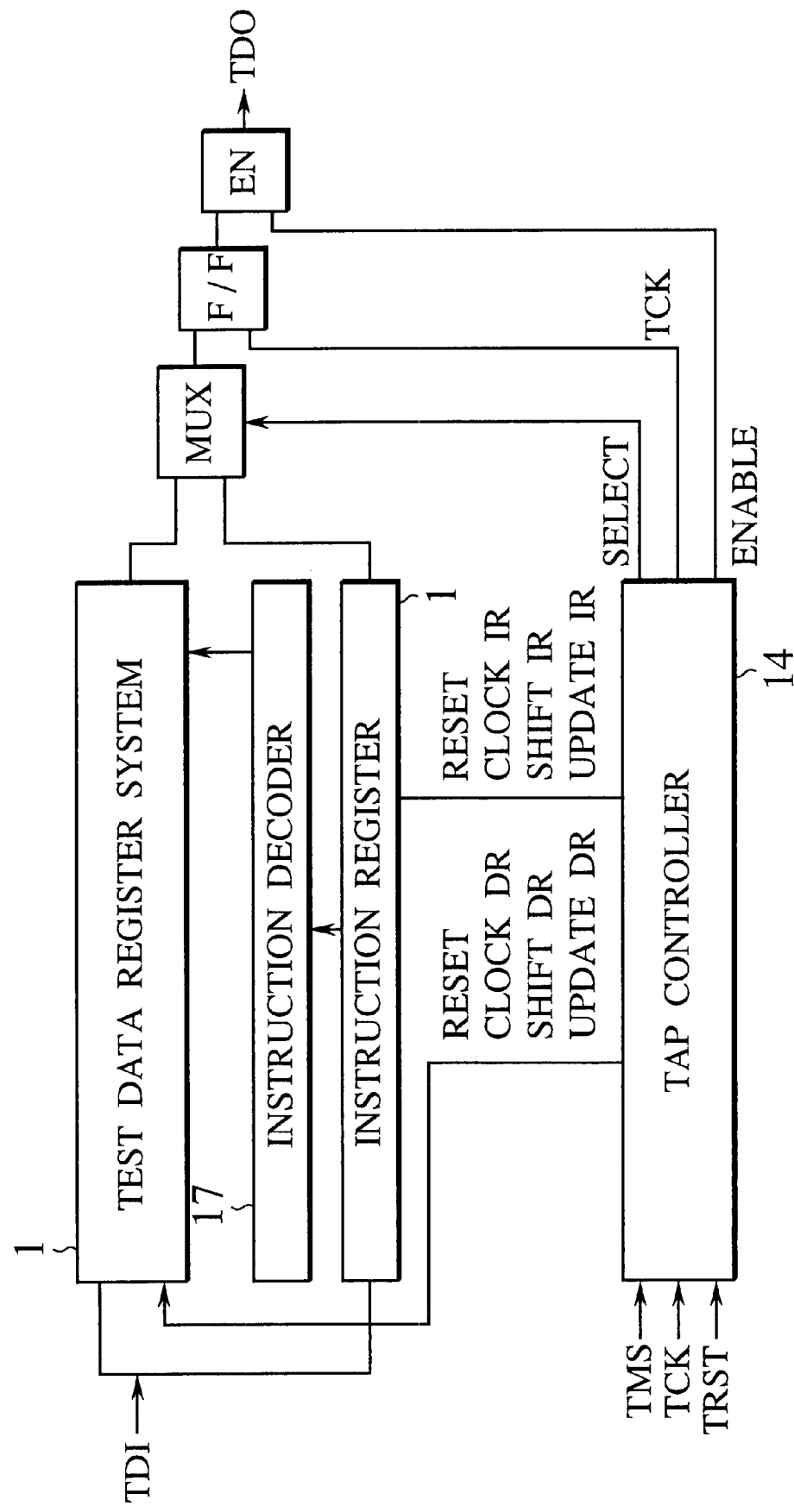
FIG. 8 is a block diagram of the Boundary-Scan test circuit in accordance with a first embodiment.

FIG. 8 is a block diagram of the Boundary-Scan test circuit in accordance with a first embodiment. In the figure, the Boundary-Scan test circuit is composed of a Test Access Port (TAP) controller 14, an instruction register 15 capable of serving as part of a scan path, an instruction decoder 17 for decoding an instruction as loaded onto the instruction register 15 and a test data register system 1 capable of serving as part of a scan path. The TAP controller 14 functions as a master controller for controlling the overall operation of the Boundary-Scan test circuit.

Figure 9:
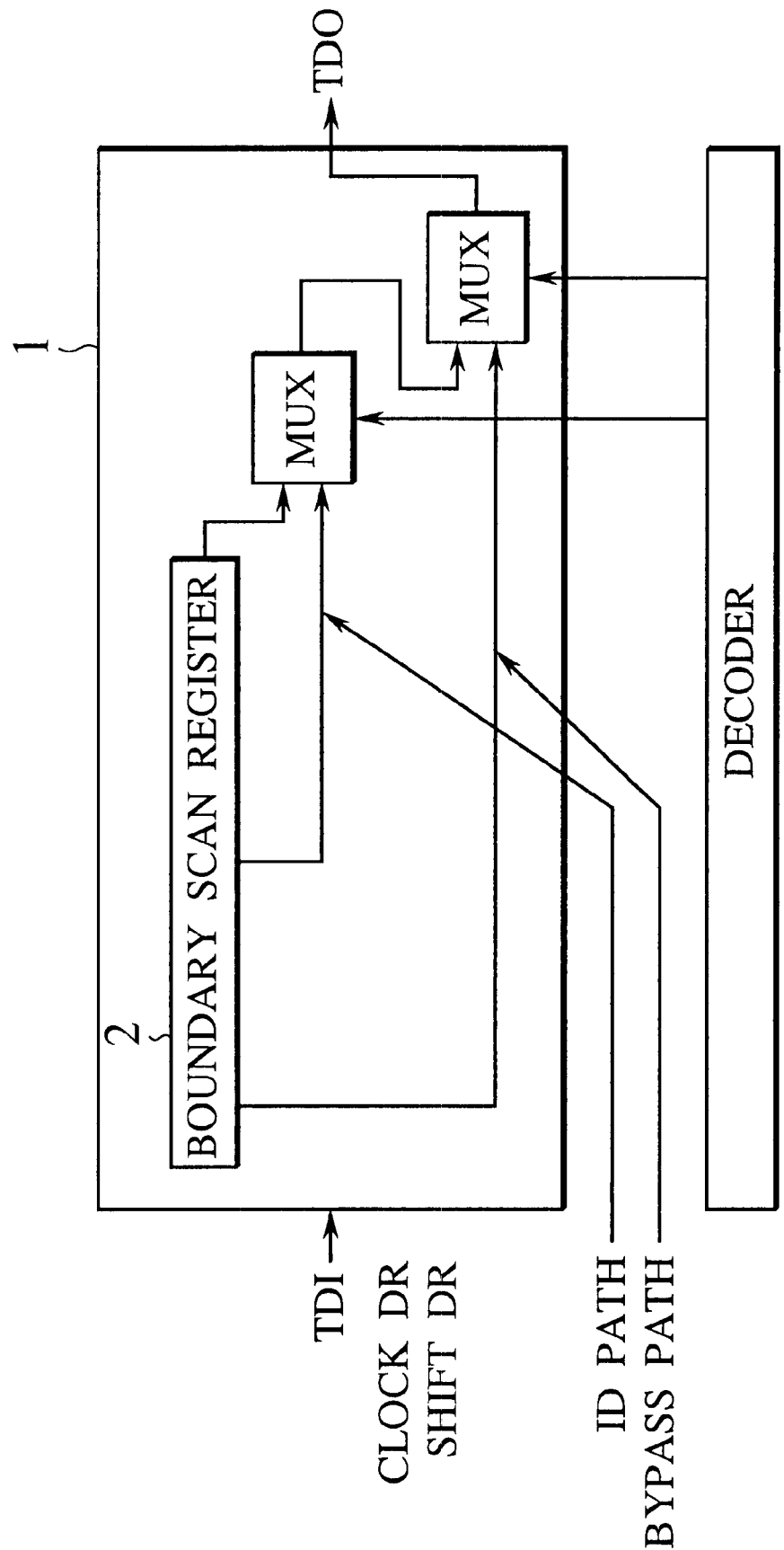
FIG. 9 is a block diagram showing the test data register system of the Boundary-Scan test circuit in accordance with the first embodiment of the present invention.

FIG. 9 is a block diagram showing the test data register system 1 of the Boundary-Scan test circuit in accordance with the first embodiment of the present invention.

Figure 10:
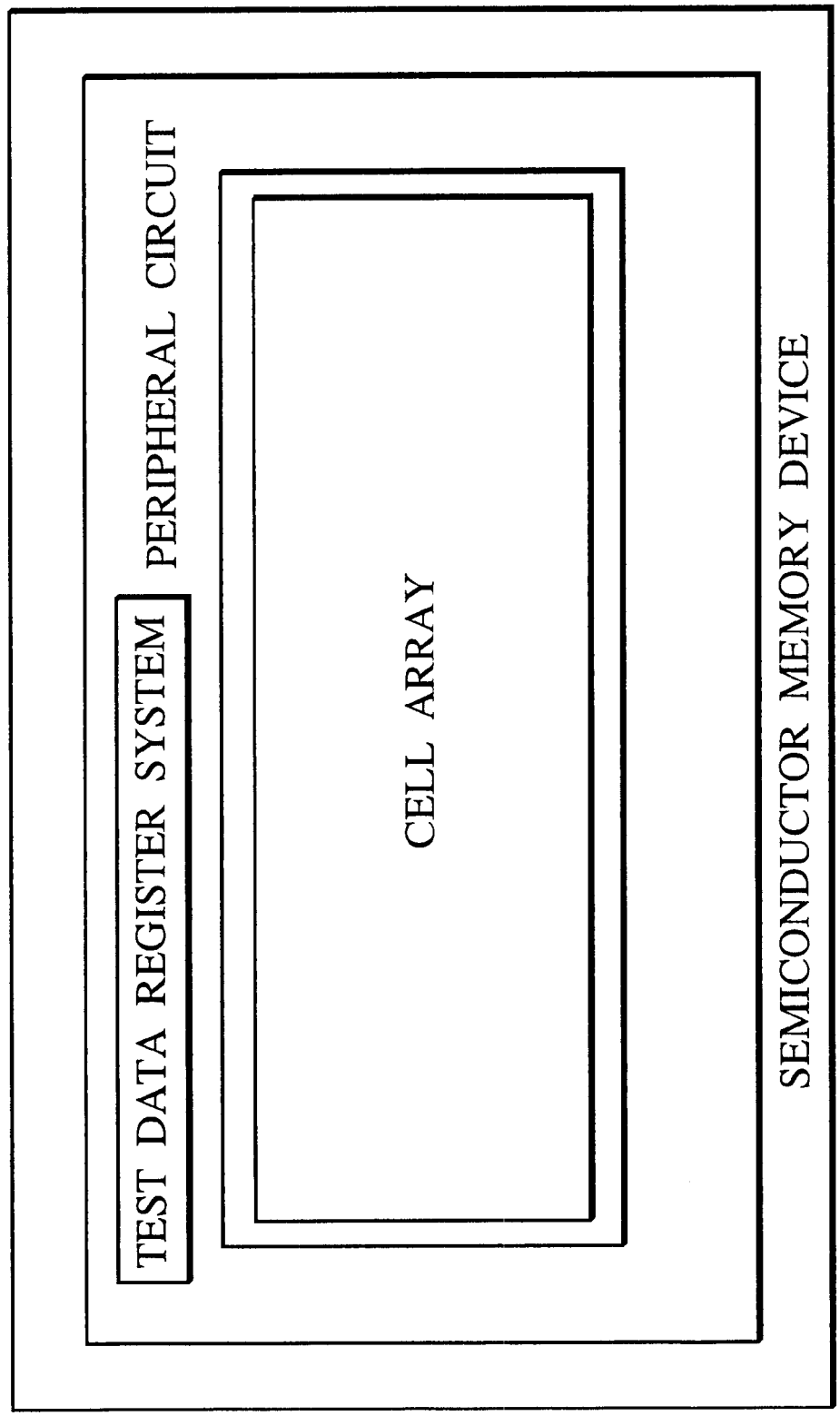
FIG. 10 is a schematic diagram showing the layout of a semiconductor data storage device chip in accordance with the first embodiment of the present invention.

In the figure, the test data register system 1 of the Boundary-Scan test circuit of this embodiment is mounted, for example, as part of the peripheral circuit of the semiconductor data storage device as illustrated in FIG. 10, which is a schematic diagram showing the layout of a semiconductor data storage device chip. Particularly, in this case, the Boundary-Scan register 2 is provided also to function as the ID-Code register and the bypass register which have been separated provided in the case of the prior art technique. While, in the case of this embodiment, the Boundary-Scan test circuit having the test data register system is provided in a semiconductor data storage device, it may be provided within semiconductor devices of ASIC or other types.

Figure 11A:
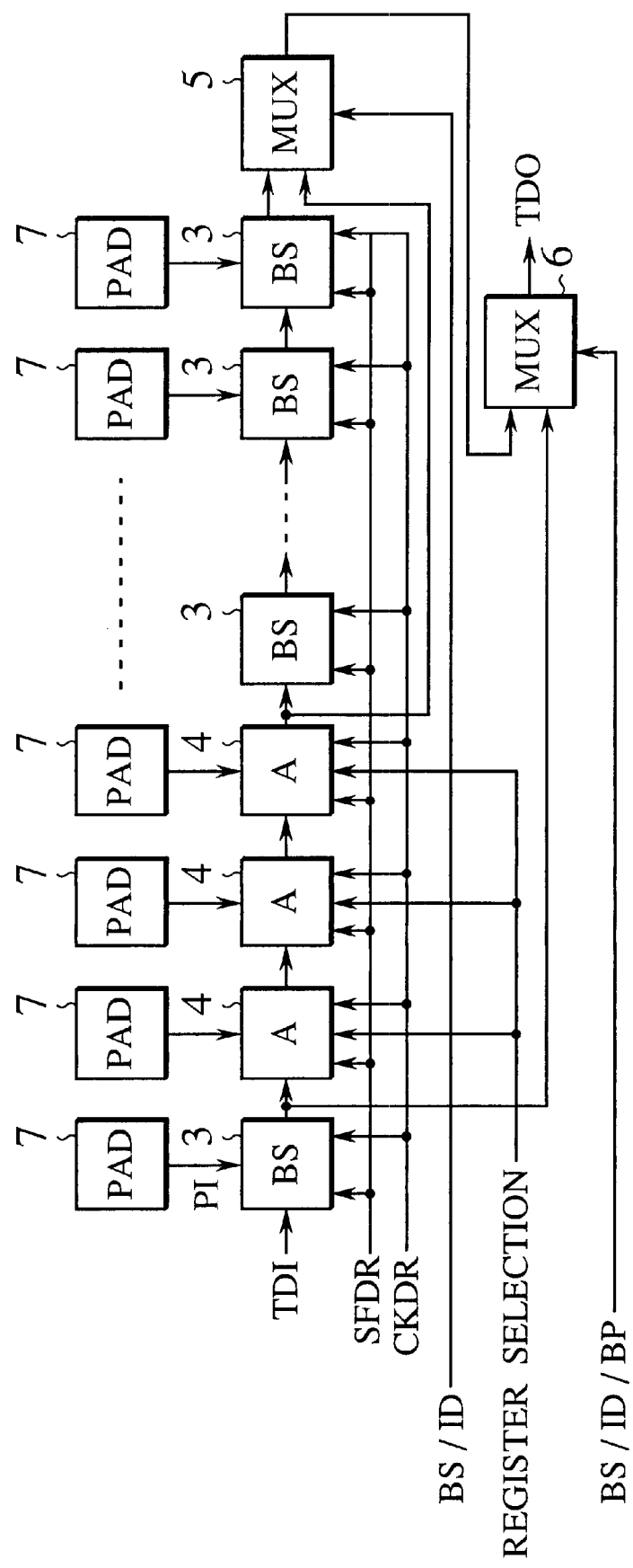
FIG. 11(A) is a block diagram showing the Boundary-Scan register also having the ID-Code register function and the bypass register function.
Figure 11B:
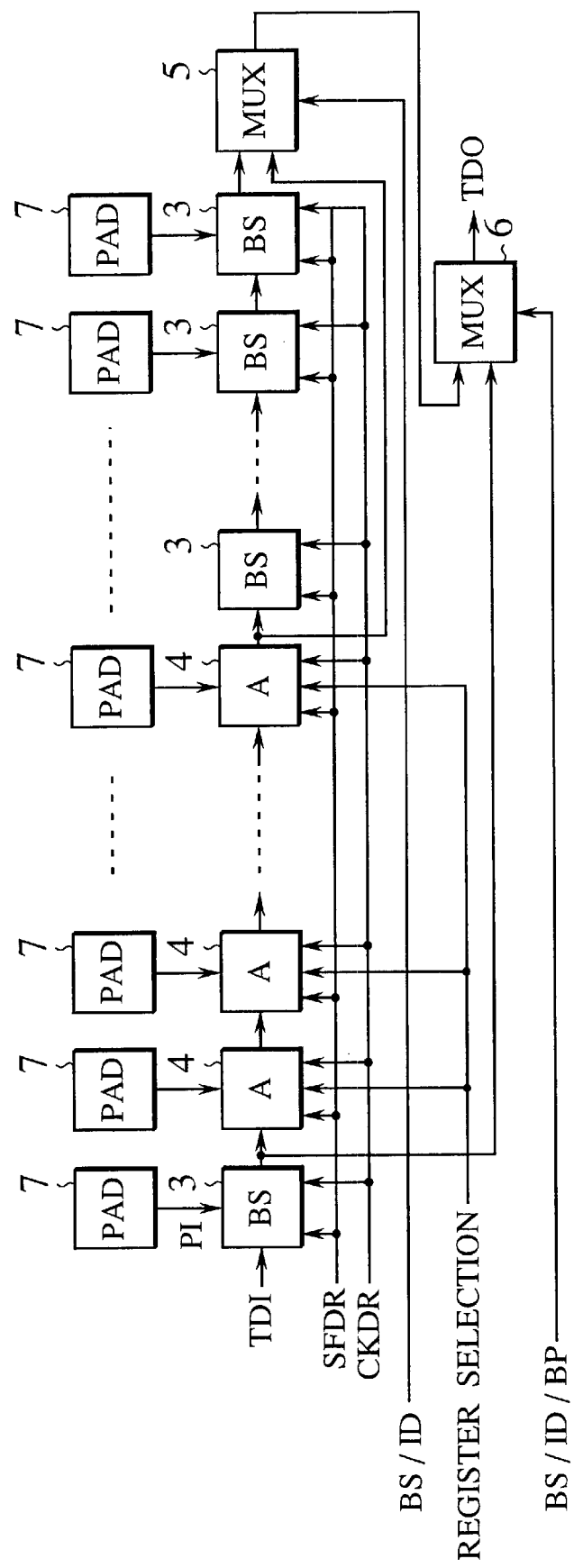
FIG. 11(B) is a block diagram showing the Boundary-Scan register also having the ID-Code register function and the bypass register function in compliance with the JTAG standard.

FIG. 11(A) is a block diagram showing the Boundary-Scan register 2 also having the ID-Code register function and the bypass register function. In the figure, the Boundary-Scan register 2 is composed of an initial stage BS circuit 3 functioning also as a bypass register, three A circuits 4 as second to fourth stages and a plurality of BS circuits 3 as fifth and subsequent stages. These stages are connected in series. The Boundary-Scan register 2 is composed also of a multiplexer (MUX) 5 which selects and outputs one of the output signal of the last stage of the A circuits 4 and the output signal of the last stage of the BS circuit 3 in accordance with a BS/ID switching signal as generated from the instruction decoder, and a multiplexer 6 which selects and outputs one of the output signal of the multiplexer 5 and the output signal of the initial stage BS circuit 3 of the Boundary-Scan register 2 in accordance with a BP/ID/BP switching signal as generated from the instruction decoder. Meanwhile, the location of the A circuits 4 is not limited to those as illustrated in FIG. 11(A). For example, the A circuits can be connected after a plurality of the BS circuits 3 as connected in series from the initial stage. Also, in the case that a Boundary-Scan test circuit is designed in accordance with the JTAG standard, there have to be provided 32 equivalent circuits of the A circuit as illustrated in FIG. 11(B). Each A circuit serves to latch one bit of the ID data respectively. Also, Each of the A circuits 4 and the BS circuits 3 is one of bit elements of the Boundary-Scan register 2 and serves to latch one bit of the data input to or output from one of the pads as stored in the Boundary-Scan register 2 respectively. The A circuits 4 and the BS circuits 3 are provided in a one-to-one correspondence with the pads.

Figure 12:
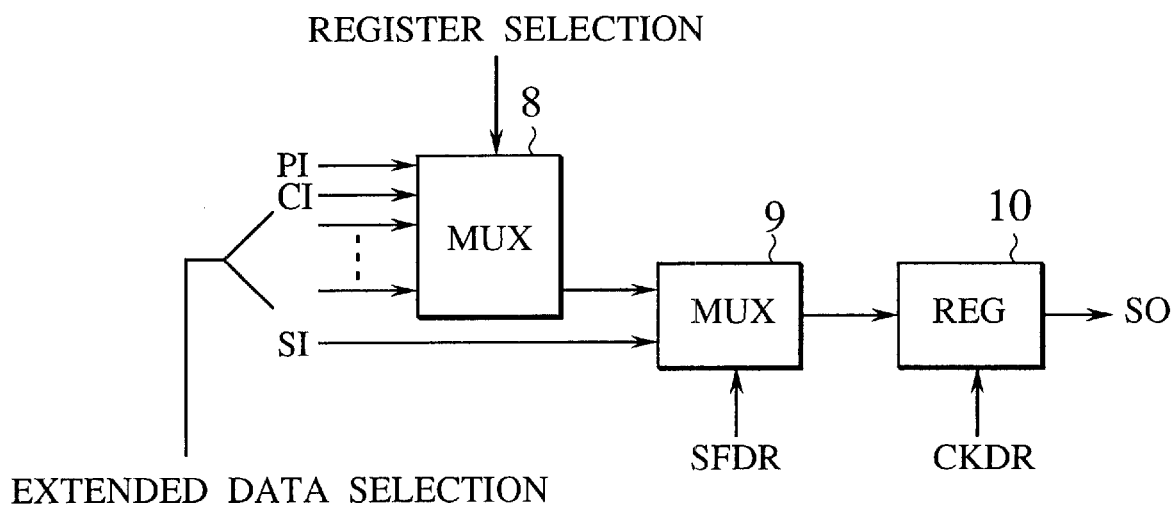
FIG. 12 is a block diagram showing each of the A circuits of the Boundary-Scan test circuit as illustrated in FIG. 11(A).

FIG. 12 is a block diagram showing each of the A circuits 4 of the Boundary-Scan test circuit as illustrated in FIG. 11(A). In the figure, the A circuit 4 is composed of a multiplexer 8, a multiplexer 9 and a register 10. The multiplexer 8 serves to selectively output, in accordance with a register switching signal, one of data PI given through the pad 7, the ID code data which is hardwired data fixedly implemented within semiconductor chips, e.g., by selectively melting and disconnecting fuses and extended data XI indicative of whether or not there are available spare elements (extra storage elements), the use of a fuse, redundancy information about the spare elements such as redundancy addresses and so forth. Other information which may be included in the extended data is the design mask information, the design version information, the lot number of wafers, the ID code of the manufacturing factory and so forth. The extended data XI is provided for use in testing respective semiconductor devices, i.e., for manufacturers of semiconductor chips, while the ID code data (CI) is provided for use in designing and manufacturing circuit boards on which are mounted semiconductor chips, i.e., for users of respective semiconductor devices. The multiplexer 8 serves to selectively output one of the output of the multiplexer 8 and data SI inputted by the scan operation in accordance with a selection signal (SFDR). The register 10 is provided for latching the data as selected by the multiplexer 9 in synchronism with the clock signal CKDR.

In such a configuration, when the Boundary-Scan register 2 functions in the same manner as a conventional Boundary-Scan register, serial data as input through the initial BS circuit 3 is passed through the second and subsequent stages comprised of the A circuits 4 and the BS circuits 3 by the scanning operation and scanned out through the multiplexer 5 and the multiplexer 6. Alternatively, also when the Boundary-Scan register 2 functions as a Boundary-Scan register, data outputted onto the pads 7 from the circuit inside of the respective integrated semiconductor chip and transferred to the A circuits 4 and the BS circuits 3 is scanned out through the multiplexer 5 and the multiplexer 6. On the other hand, when the Boundary-Scan register 2 functions in the same manner as a conventional bypass register, serial data as input through the initial BS circuit 3 is selected by and directly passed through the multiplexer 6 and outputted therefrom, bypassing the subsequent the BS circuits 3. Furthermore, when the Boundary-Scan register 2 functions in the same manner as a conventional ID-Code register, the ID code data as selectively provided by the A circuits 4 in accordance with the register switching signal is scanned out and directly passed through the multiplexer 5 and the multiplexer 6, bypassing the subsequent the BS circuits 3. Finally, when the Boundary-Scan register 2 functions to output the extended data, the extended data as selectively provided by the A circuits 4 in accordance with the register switching signal is scanned out and directly passed through the multiplexer 5 and the multiplexer 6, bypassing the subsequent the BS circuits 3.

In accordance with this embodiment, there is no need to provide separate ID-Code register and separate bypass register as opposed to the prior art technique so that the hardware amount of the test data register systems can be significantly decreased. As a result, the area penalty resulting from the provision of the Boundary-Scan test circuit is alleviated. Furthermore, since redundancy information and other information can be outputted as the extended data, necessary information for testing the storage device can be extracted from the test data register system of the Boundary-Scan test circuit rather than separately given as external information. The test procedure can be facilitated with the embedded information.

Figure 13:
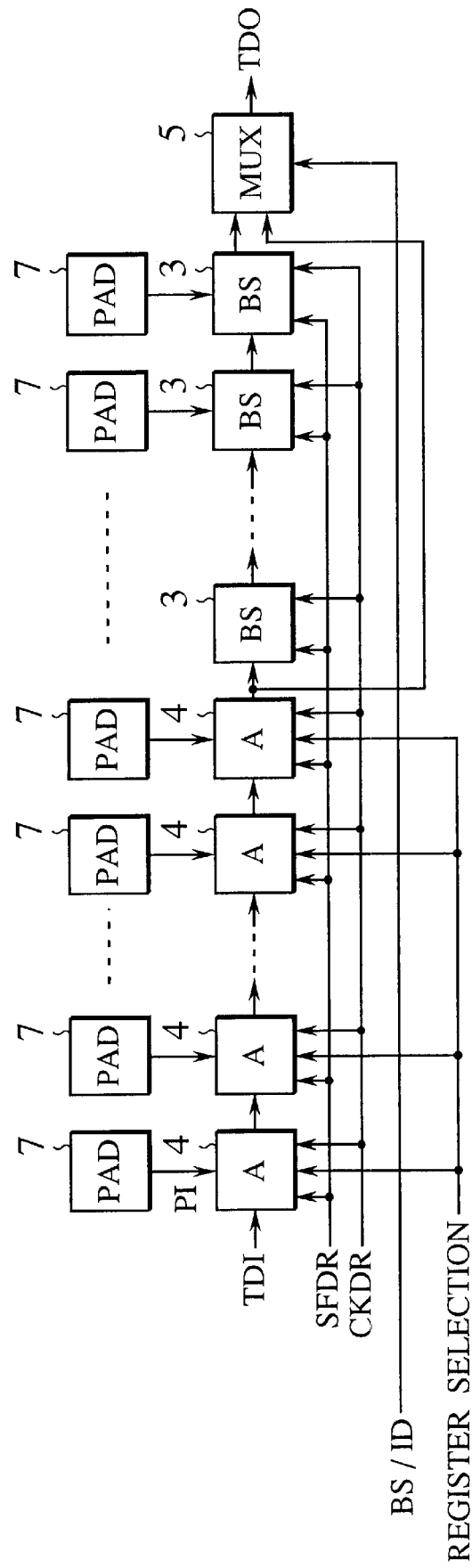
FIG. 13 is a block diagram showing the test data register system 1 of the Boundary-Scan test circuit in accordance with a second embodiment of the present invention.

FIG. 13 is a block diagram showing the test data register system 1 of the Boundary-Scan test circuit in accordance with a second embodiment of the present invention.

In the figure, the Boundary-Scan register is composed of 32 stages of A circuits 4 for outputting the ID code and the extended data and a plurality of BS circuits 3 as 33rd and subsequent stages. These stages are connected in series. The Boundary-Scan register 2 is composed also of a multiplexer (MUX) 5 which selects and outputs one of the output signal of the last stage of the A circuits 4 and the output signal of the last stage of the BS circuit 3 in accordance with a BS/ID switching signal as generated from the instruction decoder.

Figures 14, 15:
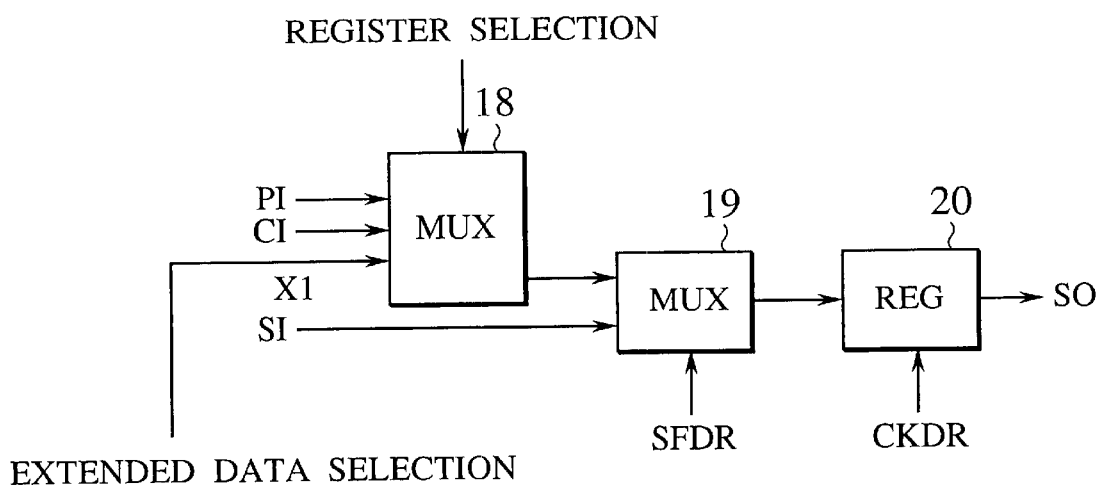
FIG. 14 is a block diagram showing each of the A circuits of the Boundary-Scan test circuit in accordance with second embodiment of the present invention.
FIG. 15 is a schematic diagram showing the contents of the extended data XI in accordance with second embodiment of the present invention.

FIG. 14 is a block diagram showing each of the A circuits 4 of this embodiment. In the figure, the A circuit 4 is composed of a multiplexer 18, a multiplexer 19 and a register 20. The multiplexer 18 serves to selectively output, in accordance with a register switching signal, one of data PI given through the pad 7, the ID code data which is hardwired data fixedly implemented within semiconductor chips, e.g., by selectively melting and disconnecting fuses and extended data XI indicative of information provided for manufacturers of semiconductor chips. The multiplexer 18 serves to selectively output one of the output of the multiplexer 18 and data SI inputted by the scan operation in accordance with a selection signal (SFDR). The register 20 is provided for latching the data as selected by the multiplexer 19 in synchronism with the clock signal CKDR. FIG. 15 is a schematic diagram showing the contents of the extended data XI in accordance with this embodiment. In this case, the extended data contains the number of spare elements as available and the addresses of the memory as restored by the spare elements. Namely, the information is given in the form of the number of the spare elements (0:2), the first memory address as restored (3:5), the second memory address as restored (6:8), the eighth memory address as restored (24:26), and not-used bits (27:31). However, the memory address of (1,1,1) means that the spare element is not used for replacement.

In such a configuration, when the Boundary-Scan register 2 functions in the same manner as a conventional Boundary-Scan register, serial data as input through the initial BS circuit 3 is passed through the initial and subsequent stages comprised of the A circuits 4 and the BS circuits 3 by the scanning operation and scanned out through the multiplexer 5. Alternatively, also when the Boundary-Scan register 2 functions as a Boundary-Scan register, data outputted onto the pads 7 from the circuit inside of the respective integrated semiconductor chip and transferred to the A circuits 4 and the BS circuits 3 is scanned out through the multiplexer 5. Also, when the Boundary-Scan register 2 functions in the same manner as a conventional ID-Code register, the ID code data as selectively provided by the A circuits 4 in accordance with the register switching signal is scanned out and directly passed through the multiplexer 5, bypassing the subsequent the BS circuits 3. Furthermore, when the Boundary-Scan register 2 functions to output the extended data, the extended data as selectively provided by the A circuits 4 in accordance with the register switching signal is scanned out and directly passed through the multiplexer 5, bypassing the subsequent the BS circuits 3.

Namely, the Boundary-Scan register 2 of this embodiment is provided also to function as the ID-Code register which has been separated provided in the case of the prior art technique. As a result, the area penalty resulting from the provision of the Boundary-Scan test circuit is alleviated.

Figure 16:
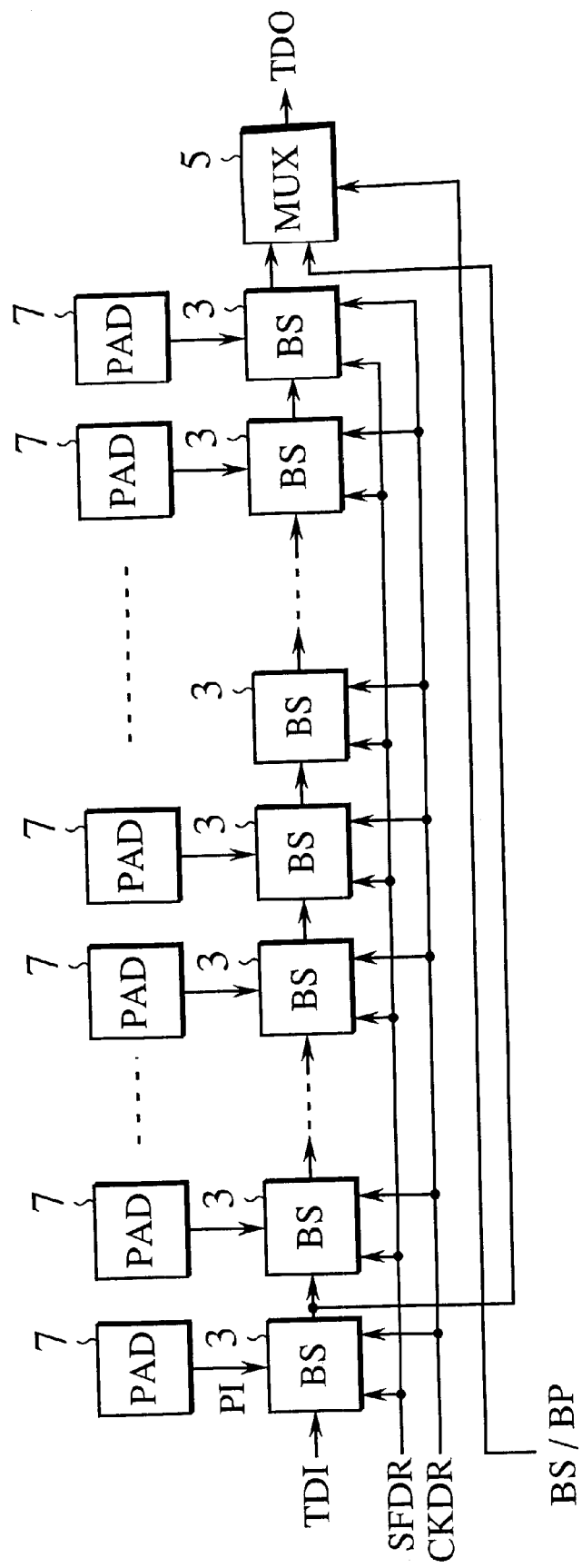
FIG. 16 is a block diagram showing the test data register system 1 of the Boundary-Scan test circuit in accordance with a third embodiment of the present invention.

FIG. 16 is a block diagram showing the test data register system 1 of the Boundary-Scan test circuit in accordance with a third embodiment of the present invention. In the figure, the Boundary-Scan register 2 is composed of a plurality of BS circuits 3 connected in series. The initial stage BS circuit 3 functions also as a bypass register. The Boundary-Scan register 2 is composed also of a multiplexer 11 which selects and outputs one of the output signal of the initial BS circuits 3 and the output signal of the last stage of the BS circuit 3 in accordance with a BS/BP switching signal as generated from the instruction decoder.

Namely, the Boundary-Scan register 2 of this embodiment is provided also to function as the bypass register which has been separated provided in the case of the prior art technique. As a result, the area penalty resulting from the provision of the Boundary-Scan test circuit is alleviated.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor device provided with a Boundary-Scan test circuit comprising:
    an instruction register for latching an instruction required for carrying out a Boundary-Scan test of the semiconductor device;
    an instruction decoder for decoding an instruction as loaded to the instruction register; and
    a test data register system controlled by control signals output from the instruction decoder;
    the test data register system comprising a Boundary-Scan test register composed of bit elements serially connected to each other in the form of a scan path and each of which is connected respectively to one of pads of the semiconductor device,
    wherein part of the bit elements of the Boundary-Scan test register functions also as an ID-Code register which is capable of selectively outputting either of the ID-Code of the semiconductor device or extended data.

2. The semiconductor device provided with a Boundary-Scan test circuit as claimed in claim 1 wherein the instruction register functions as a scan path through which the instruction is loaded to the instruction register by scanning operation.

3. The semiconductor device provided with a Boundary-Scan test circuit as claimed in claim 1 wherein the extended data includes information for the manufacturer of the semiconductor device.

4. The semiconductor device provided with a Boundary-Scan test circuit as claimed in claim 1 wherein the extended data is indicative of whether or not there are available spare elements, the use of a fuse, or redundancy information about the spare elements such as redundancy addresses.

5. The semiconductor device provided with a Boundary-Scan test circuit as claimed in claim 1 further comprising a Test Access Port controller for controlling operation of the Boundary-Scan test circuit.

6. The semiconductor device provided with a Boundary-Scan test circuit as claimed in claim 1 further comprising a multiplexer which selects and outputs one of the output signal of the initial bit element and the output signal of the last bit element in accordance with a control signal as generated from the instruction decoder.

7. A semiconductor device provided with a Boundary-Scan test circuit comprising:

an instruction register for latching an instruction required for carrying out a Boundary-Scan test;

an instruction decoder for decoding an instruction as loaded onto the instruction register; and a test data register system controlled by control signals output from the instruction decoder;

the test data register system comprising a Boundary-Scan test register composed of bit elements serially connected to each other in the form of a scan path and each of which is connected respectively to one of pads of the semiconductor device, wherein an initial bit element of the Boundary-Scan test register functions also as a bypass register for bypassing the subsequent bit elements of the Boundary-Scan test register.

8. The semiconductor device provided with a Boundary-Scan test circuit as claimed in claim 7 further comprising a Test Access Port controller for controlling operation of the Boundary-Scan test circuit.

9. The semiconductor device provided with a Boundary-Scan test circuit as claimed in claim 7 further comprising a multiplexer which selects and outputs one of the output signal of the initial bit element and the output signal of the last bit element in accordance with a control signal as generated from the instruction decoder.

10. The semiconductor device provided with a Boundary-Scan test circuit as claimed in claim 7 wherein the instruction register functions as a scan path through which the instruction is loaded to the instruction register by scanning operation.

11. A semiconductor device provided with a Boundary-Scan test circuit comprising:

an instruction register for latching an instruction required for carrying out a Boundary-Scan test;

an instruction decoder for decoding an instruction as loaded onto the instruction register; and a test data register system controlled by control signals output from the instruction decoder;

the test data register system comprising a Boundary-Scan test register composed of bit elements serially connected to each other in the form of a scan path and each of which is connected respectively to one of pads of the semiconductor device, wherein part of the bit elements of the Boundary-Scan test register functions also as an ID-Code register while an initial bit element of the Boundary-Scan test register functions also as a bypass register for bypassing the subsequent bit elements of the Boundary-Scan test register.

* * * * *